US005710624A

United States Patent [19]

Utamura

[11] Patent Number: 5,710,624
[45] Date of Patent: Jan. 20, 1998

[54] ALIGNER AND CONTAMINATION DETECTING METHOD

[75] Inventor: Shinji Utamura, Utsunomiya, Japan

[73] Assignee: Canon Kabushiki Kaisha, Tokyo, Japan

[21] Appl. No.: 564,564

[22] Filed: Nov. 29, 1995

[30] Foreign Application Priority Data

Dec. 9, 1994 [JP] Japan ................................. 6-330953
Jul. 31, 1995 [JP] Japan ................................. 7-213016

[51] Int. Cl.$^6$ ................................................. G01N 21/88
[52] U.S. Cl. ................................. 356/237; 250/548
[58] Field of Search ................................. 356/237, 399, 356/400, 401; 250/548

[56] References Cited

U.S. PATENT DOCUMENTS

| | | | |
|---|---|---|---|
| 4,460,273 | 7/1984 | Koizumi et al. | 356/237 |
| 4,668,089 | 5/1987 | Oshida et al. | 356/237 |
| 4,780,616 | 10/1988 | Nishi et al. | 250/548 |
| 4,811,059 | 3/1989 | Hamasaki et al. | 355/77 |
| 4,823,012 | 4/1989 | Kosugi | 356/400 |
| 5,191,200 | 3/1993 | Van Der Werf et al. | 250/548 |
| 5,469,263 | 11/1995 | Waldo, III et al. | 356/401 |
| 5,483,056 | 1/1996 | Imai | 250/548 |

*Primary Examiner*—Frank G. Font
*Assistant Examiner*—Zandra V. Smith
*Attorney, Agent, or Firm*—Fitzpatrick, Cella, Harper & Scinto

[57] ABSTRACT

An aligner for exposing a pattern image of an original plate by projecting the image onto an exposure surface of a substrate, which is held on a table, in a focused state through a projection optical system includes a defocusing detection device for detecting a deviation from a focusing position at each of a plurality of points within an exposure region on the surface of the substrate, which is arranged at an exposure position, a device for determining an approximate plane of the exposure surface of the substrate within the exposure region on the basis of deviation detection values detected by the defocusing detection device at the plurality of points by the defocusing detection device and a decision device for determining a deviation of the approximate plane of the exposure surface of the substrate, on the basis of the deviation detection values detected at each of the plurality of points, to decide whether contamination is present between the table and the back side of the substrate. Also disclosed is a contamination detecting method applied to such an aligner.

12 Claims, 6 Drawing Sheets

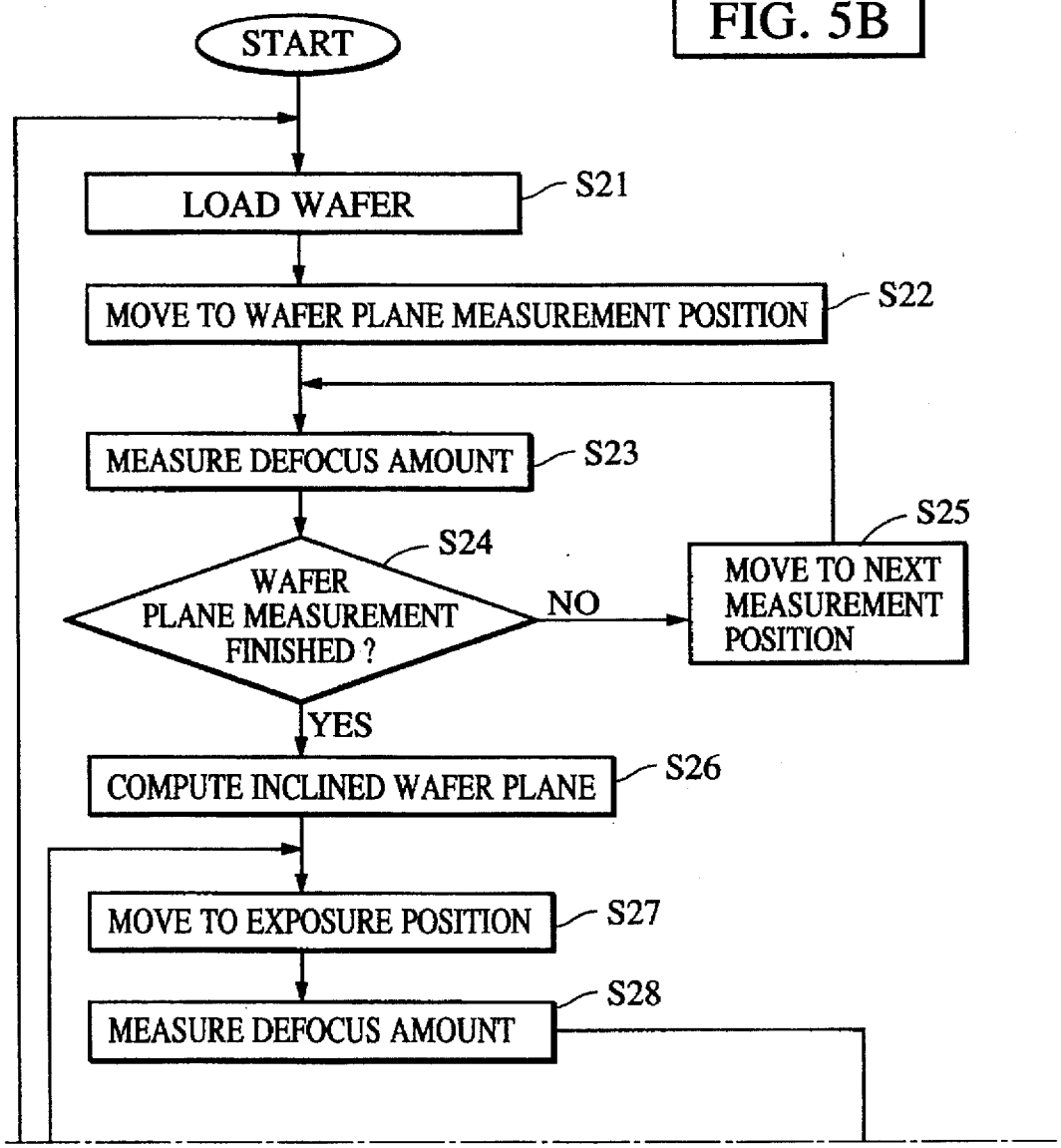

ALIGNER AND CONTAMINATION DETECTING METHOD

BACKGROUND OF THE INVENTION

1. Field of the Invention

The present invention relates to an aligner for exposing a pattern image of an original sheet such as a reticle onto a substrate such as a wafer or the like, and a method of detecting contamination on the back side of the wafer to prevent defocusing, caused by the contamination, in the aligner.

2. Description of the Related Art

In a step-and-repeat type (including a step-and-scan type) aligner, i.e., a stepper, used for manufacturing a semiconductor device, focusing is generally carried out for each exposure. However, dust particles such as resist residue sometimes adhere to the back side of a wafer as the process proceeds, and thus, the wafer locally warps, thereby causing nonuniform focusing over the entire surface of an exposure region. Therefore, poor resolution occurs in the exposure region, and a problem of deteriorating the yield arises.

It is thus necessary to detect contamination in the exposure process. An example of conventional detection methods is a method of detecting the presence of contamination based on a difference between a focusing point in each exposure region and a focusing point in the previous exposure region. Since a focusing plane is generally in the central portion of each exposure region, data regarding a focusing position near the center of each exposure region is used in the contamination detecting method.

SUMMARY OF THE INVENTION

However, the above contamination detecting method has a problem in that a recent trend in enlargement of the exposure region makes it impossible to accurately detect contamination only by using data regarding a focusing position near the center of the exposure region. There is also a problem that the detection result contains error due to a positional deviation in the focusing direction, which is caused by an inclination component of a stage and a wedge component of a wafer when the stage is driven between adjacent exposure regions between which a comparison of focusing positions is made, thereby reducing the precision of contamination detection.

In consideration of the above problems of the prior art, an object of the present invention is to improve the precision in detecting contamination on the back side of a substrate, such as a wafer or the like, in a semiconductor aligner, for example, a step-and-repeat type aligner.

In order to achieve the object, in accordance with an embodiment of the present invention, an aligner for exposing a pattern image of an original plate by projecting the image onto an exposure surface of a substrate, which is clamped on a table, in a focused state through a projection optical system comprises defocusing detection means for detecting a deviation from a focusing position at each of a plurality of points in an exposure region on the exposure surface of the substrate, which is arranged at an exposure position, means for determining an approximate plane of the exposure surface of the substrate within the exposure region based on deviation detection values detected at the plurality of points, and decision means for determining a deviation of the approximate plane of the exposure surface of the substrate on the basis of deviation detection values detected at each of the plurality of points, to decide whether contamination is present between the table and the back side of the substrate.

In accordance with another embodiment of the present invention, an aligner for exposing a pattern image of an original plate by projecting the image onto an exposure surface of a substrate, which is clamped on a table, in a focused state through a projection optical system, comprises focusing detection means for detecting defocusing from a focusing position at each of a plurality of points within an exposure region on the exposure surface of the substrate, which is arranged at an exposure position, means for determining an approximate plane of the exposure surface of the substrate within the exposure region based on defocusing detection values detected at the plurality of points, and decision means for determining a deviation of the approximate plane of the substrate at a current position, on the basis of an approximate plane determined for another portion of the exposure surface of the substrate at a previous exposure position, to decide whether contamination is present between the table and the back side of the substrate.

In accordance with still another embodiment of the present invention, an aligner for exposing a pattern image of an original plate by projecting the image onto an exposure surface of a substrate, which is clamped on a table, in a focused state through a projection optical system comprises defocusing detection means for detecting defocusing from a focusing position at each of (i) at least three points on the exposure surface of the substrate, and (ii) a plurality of points within an exposure region on the exposure surface of the substrate, which is arranged at an exposure position; means for determining an approximate plane of the entire exposure surface of the substrate on the basis of defocusing detection values detected at each of the at least three points on the exposure surface of the substrate; means for determining an approximate plane within the exposure region of the exposure surface of the substrate on the basis of defocusing detection values detected at the plurality of points within the exposure region; and decision means for determining a deviation of the approximate plane of the entire surface of the substrate on the basis of the approximate plane determined within the exposure region, to decide whether contamination is present between the table and the back side of the substrate.

In accordance with a further embodiment of the present invention, the aligner further comprises decision means for determining a deviation of the approximate plane from each of detection values at detection points within a previous exposure region, to decide whether contamination is present, when a sufficient number of detection values are not detected at a plurality of points within an exposure region, in step-and-repeat exposure of the substrate.

In accordance with a still further embodiment of the present invention, a contamination detecting method applied to an aligner for exposing a pattern image of an original plate by projecting the image onto an exposure surface of a substrate, which is clamped on a table, in a focused state through a projection optical system, comprises the steps of detecting a deviation from a focusing position at each of a plurality of points within an exposure region on the exposure surface of the substrate, which is arranged at an exposure position; determining an approximate plane of the exposure surface of the substrate within the exposure region on the basis of defocusing detection values detected at the plurality of points; determining a deviation of the approximate plane on the basis of defocusing detection values detected at each of the plurality of detection points; and deciding, on the basis of the determined deviations, whether contamination is present between the table and the back side of the substrate.

In accordance with another embodiment of the present invention, a contamination detecting method applied to an aligner for exposing a pattern image of an original plate by projecting the image onto an exposure surface of a substrate, which is clamped on a table, in a focused state through a projection optical system, comprises the steps of detecting defocusing from a focusing position at each of a plurality of points within an exposure region on the exposure surface of the substrate, which is arranged at an exposure position; determining an approximate plane of the substrate within the exposure region on the basis of defocusing detection values detected at each the plurality of points; determining a deviation of the approximate plane of the substrate at a current position, on the basis of an approximate plane determined for another portion of the exposure surface of the substrate, at a previous exposure position; and deciding, on the basis of the determined deviation of the approximate plane of the substrate at the current position, whether contamination is present between the table and the back side of the substrate.

In accordance with a further embodiment of the present invention, a contamination detecting method applied to an aligner for exposing a pattern image of an original plate by projecting the image onto an exposure surface of a substrate, which is clamped on a table, in a focused state through a projection optical system, comprises the steps of detecting defocusing from a focusing position at each of at least three points on the exposure surface of the substrate, detecting defocusing from a focusing position at each of a plurality of points within an exposure region on the exposure surface of the substrate, which is arranged at an exposure position; determining an approximate plane of the entire exposure surface of the substrate on the basis of defocusing detection values detected at the at least three points on the exposure surface of the substrate; determining an approximate plane within the exposure region on the exposure surface of the substrate, based on defocusing detection values detected at each of the plurality of detection points within the exposure region; determining a deviation of the approximate plane of the entire exposure surface of the substrate, on the basis of the approximate plane determined within the exposure region; and deciding, on the basis of the determined deviation of the approximate plane of the entire surface of the substrate, whether contamination is present between the table and the back side of the substrate.

In accordance with a still further embodiment of the present invention, the contamination detecting method comprises a further step of determining a deviation of the approximate plane from each of detection values obtained at detection points within a previous exposure region, to decide whether contamination is present, when a sufficient number of values are not detected at a plurality of points within an exposure region, in step-and-repeat exposure of a substrate.

In the present invention, a deviation from a focusing position at each of a plurality of points within an exposure region on an exposure surface of a substrate, which is arranged at an exposure position, is detected, an approximate plane of the exposure surface of the substrate within the exposure region is determined on the basis of deviation detection values detected at the plurality of points, and a deviation of values detected at each of the plurality of points or an approximate plane of the entire exposure surface of the substrate is determined, from the determined approximate plane, to decide, on the basis of the deviation determined, whether or not contamination is present between the table and the back side of the substrate. Thus, the detection results contain no error due to a positional deviation in the focusing direction when driving a stage between adjacent exposure shots, thereby permitting detection with high precision. A decision is made, for the entire surface within an exposure region in accordance with the arrangement of detection points, as to whether or not contamination is present.

BRIEF DESCRIPTION OF THE DRAWINGS

FIG. 5, including FIGS. 5A and 5B, is a flowchart showing the operation of the aligner shown in FIG. 1, in accordance with a second embodiment of the present invention.

DESCRIPTION OF THE PREFERRED EMBODIMENTS

Figure 1:
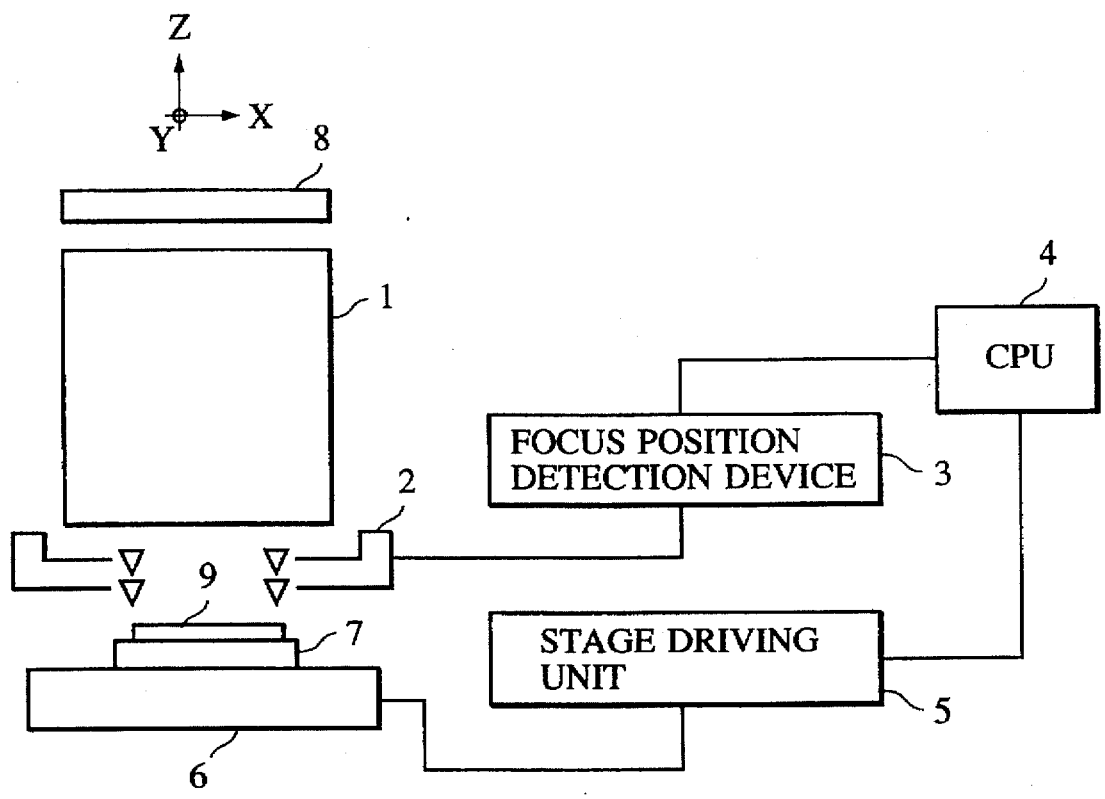
FIG. 1 is a drawing illustrating the outline of a principal portion of an aligner in accordance with an embodiment of the present invention.

FIG. 1 is a drawing illustrating the outline of a principal portion of a step-and-repeat type (including a step-and-scan type) aligner in accordance with an embodiment of the present invention.

Figure 2:
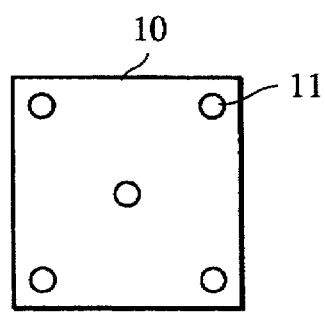
FIG. 2 is a drawing illustrating the arrangement of focusing position detection points within an exposure region in the aligner shown in FIG. 1.

In FIG. 1, reference numeral 1 denotes a projection optical system for reducing and projecting a pattern of a reticle 8 on an exposure surface of a wafer 9; reference numeral 2, five focusing position detection systems (this drawing shows only four systems) for outputting data signals about a Z-direction deviation of the exposure surface of the wafer 9 from the focusing plane of the projection optical system 1; reference numeral 3, a focusing position detection device for detecting a deviation of the exposure surface of the wafer 9 from the focusing plane on the basis of the signals output from the focusing position detection systems 2; reference numeral 6, an X-Y stage for moving the wafer 9 in the X-Y directions; reference numeral 7, a focusing position alignment stage provided on the XY stage so as to align the exposure surface of the wafer 9 to the focusing plane of the projection optical system 1; reference numeral 5, a stage driving unit for driving the stages 6 and 7; and reference numeral 4, a CPU for controlling the stage driving unit 5 based on the output from the focusing position detection device 3. The five focusing position detection systems 2 are arranged so as to respectively detect deviation at five detection points 11 within an exposure region 10 of the projection optical system 1, as shown in FIG. 2. For example, each of the focusing position detection systems 2 comprises laser irradiation means for applying a laser beam to a detection point, and photoelectric conversion means for detecting light reflected from the detection point 11, the incident position of the reflected light on the photoelectric conversion means corresponding to a deviation from the focusing position and an accurate reflection position at each of the detection positions 11.

Figure 3:
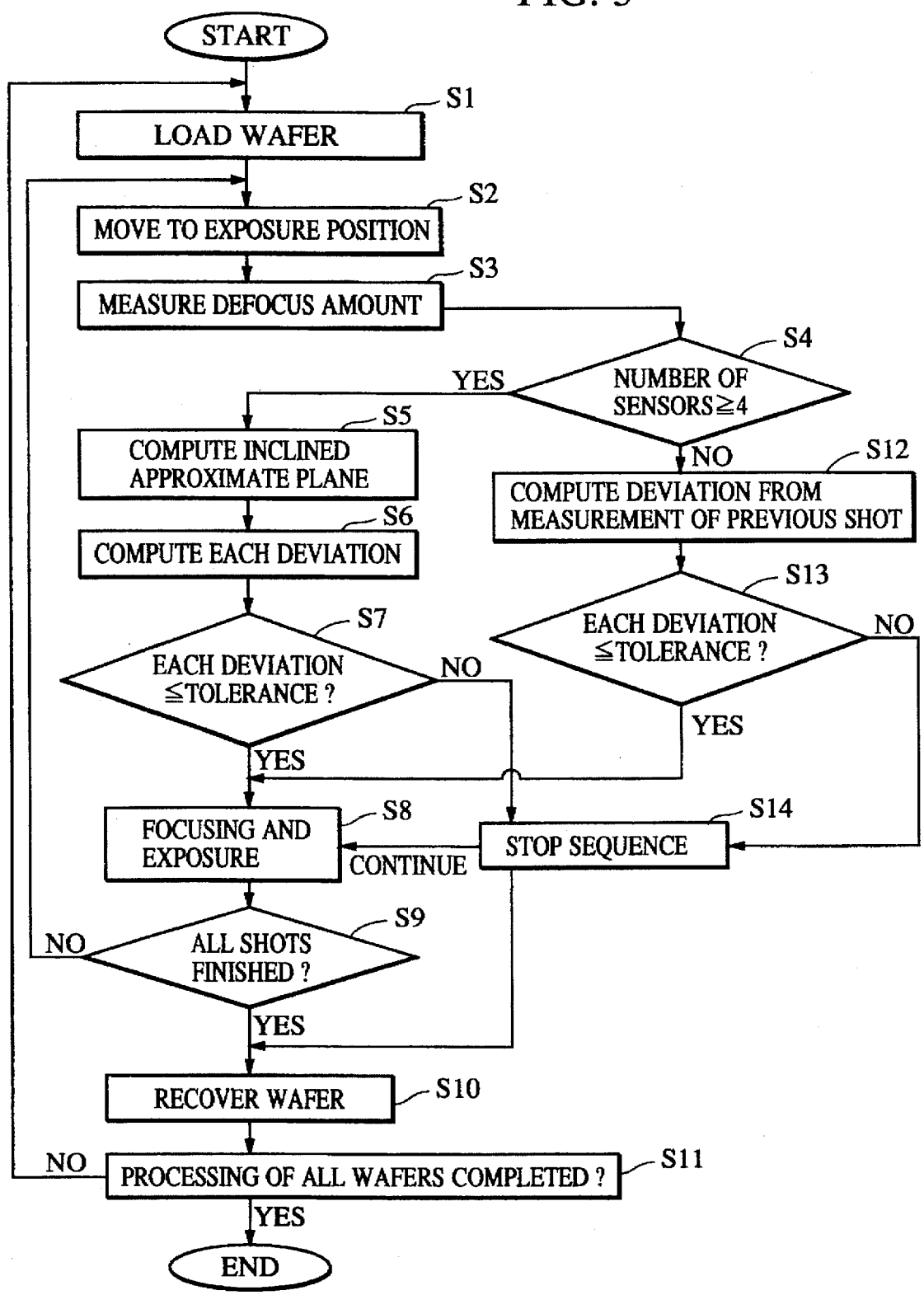
FIG. 3 is a flowchart showing the operation of the aligner shown in FIG. 1 in accordance with a first embodiment of the present invention.

The operation of the aligner will be described below with reference to a flowchart shown in FIG. 3.

When a start command is input to the CPU 4 from command means (not shown), the CPU 4 transfers the wafer 9 and loads it on the focusing position alignment stage 7 by a wafer transfer system (not shown) in Step S1. The X-Y stage 6 is then driven to a first exposure shot position in Step S2. The focusing position detection systems 2 then respectively detect defocusing amounts at the detection points 11 within an exposure region in Step S3. A decision is made in Step S4 whether or not deviations are detected at at least four of the five detection points 11. When deviations are detected at at least four points, the operation advances to Step S5. When deviations are detected at less than four points, the operation moves to Step S12. The case where deviations are detected at less than four points represents the case where the exposure region is in the peripheral portion of the wafer 9, and some of the detection points 11 are thus out of the surface of the wafer 9. In this case, a comparison is made with measured values in the previous shot, as described below.

When the operation advances to Step S5, an approximate plane of the exposure surface of the wafer 9 within the exposure region 10 is determined based on the detection result (position in the Z direction) obtained at each of the detection points 11 and data regarding the positions (in the X-Y directions) of the detection points 11. In Step S6, a deviation (deviation from the approximate plane) at each of the detection points 11 is then determined by comparing the detection result obtained at each of the detection points 11 with the approximate plane determined in Step S5. The deviation at each of the detection points 11 is then compared with a specified value (tolerance) in Step S7. If at least one of the deviations exceeds the tolerance, it is decided that contamination might be present, and the operation moves to Step S14 in which the sequence is interrupted. When the sequence is interrupted, it is possible to select a continuation of the sequence or stoppage (forced recovery) of processing of the wafer in accordance with directions from an operator. When the operator provides instructions to continue the sequence, the operation advances to Step S8. When it is decided in Step S7 that the deviations do not exceed the tolerance, the operation immediately moves to Step S8 for performing focusing by the focusing stage 7 and exposing of an image. A decision is made in Step S9 whether or not all shots are completed. If all the shots are not completed, the operation returns to Step S2 for carrying out step movement to a next shot position. When it is decided that all shots are completed, the operation advances to Step S10.

On the other hand, when it is decided in Step S4 that deviations are not detected at least four detection points 11, and when the operation moves to Step S12, in Step S12, a deviation from an approximate plane in the previous shot is determined for each of the detection points 11 where deviations were detected. A decision is then made in Step S13 whether or not the deviations are within the predetermined tolerance. If the deviations are within the tolerance, the operation moves to Step S8. If the deviations are over the tolerance, the operation moves to Step S14.

In Step S10, the wafer for which all shots are completed or the wafer for which processing is stopped on the basis of the directions from the operator in Step S14 is discharged by the wafer transfer system and recovered by a wafer cassette outside the aligner. A decision is made in Step S11 whether or not processing of all wafers of one lot is finished. If so, operation of the aligner is terminated. If not, processing returns to Step S1 for transferring a next wafer.

Figure 4:
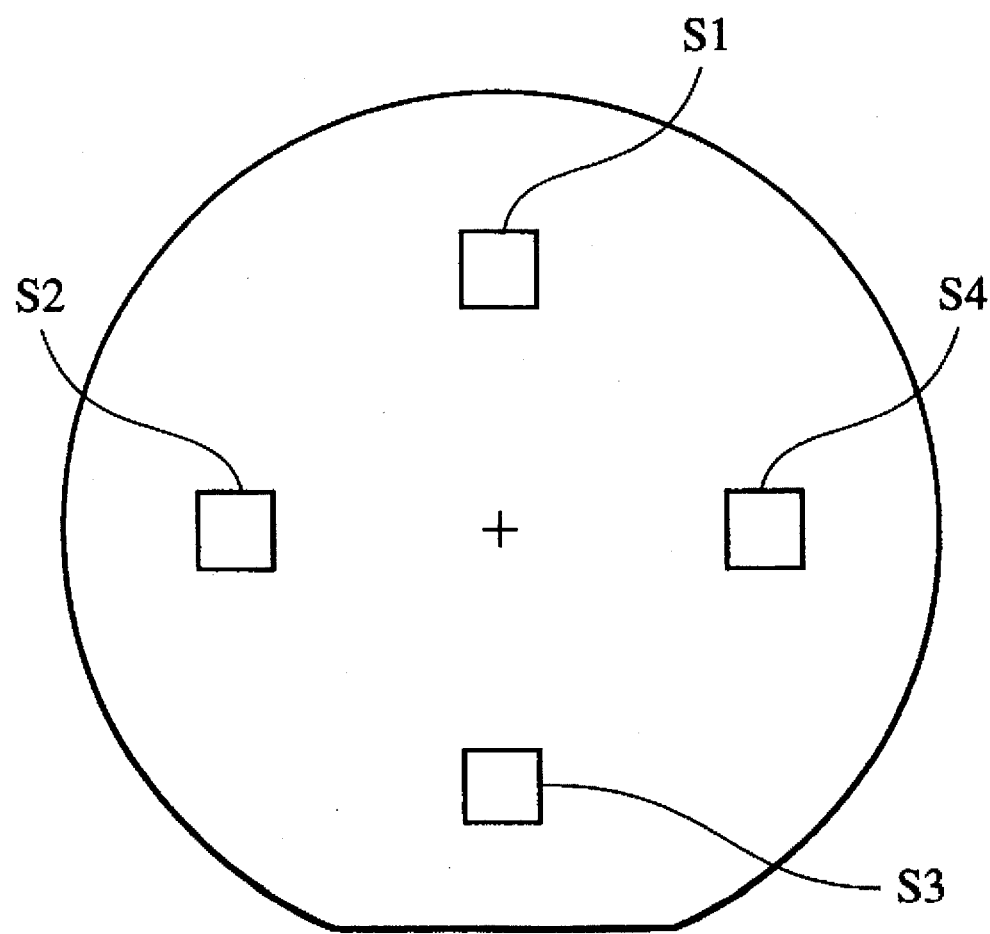
FIG. 4 is a drawing illustrating an example of an arrangement of measurement shots used for determining a wafer plane by the aligner shown in FIG. 1.
Figure 5B:
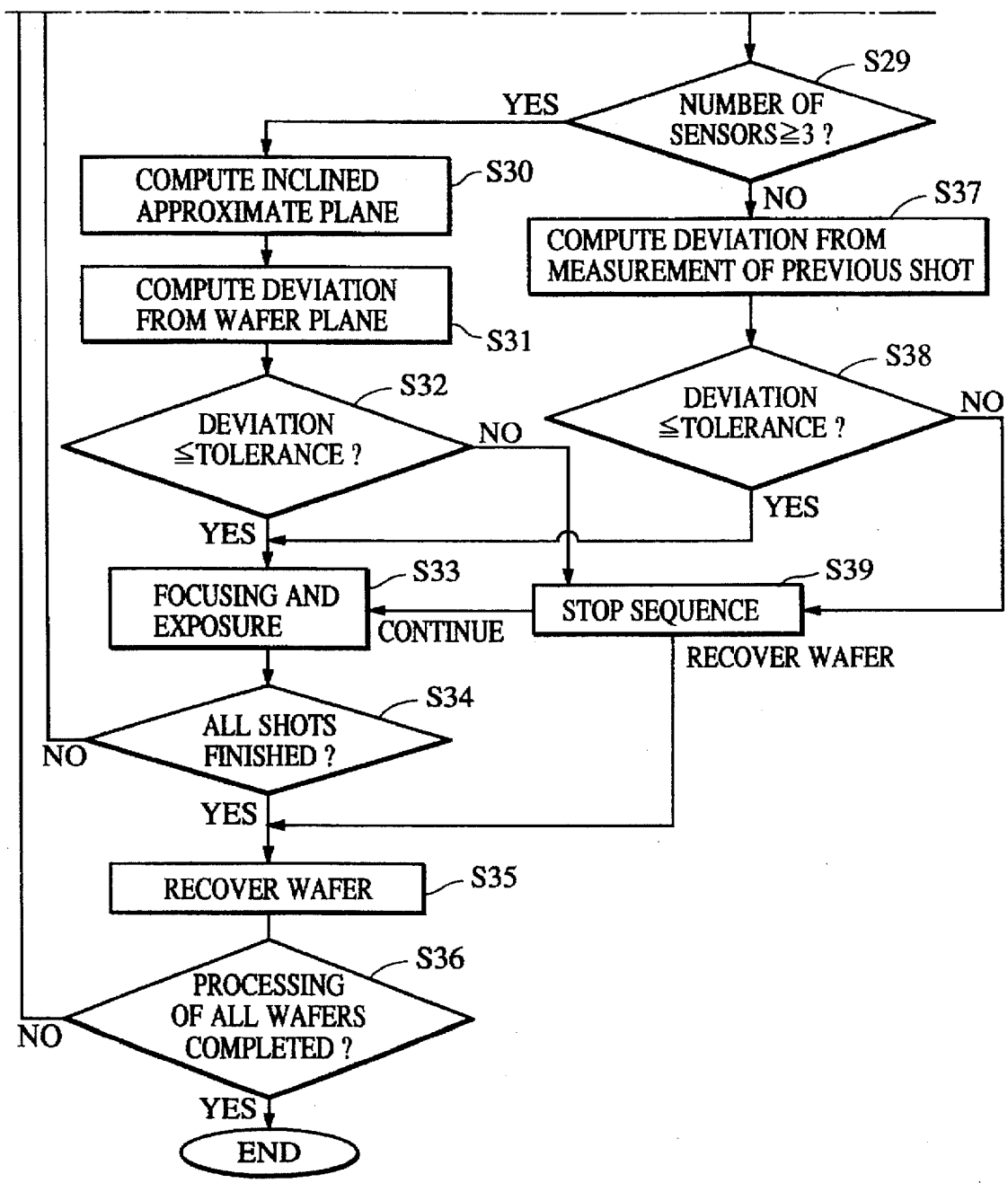

FIG. 5, including FIGS. 5A and 5B, is a flowchart illustrating the operation of an aligner in accordance with a second embodiment of the present invention. The construction of the aligner is the same as that shown in FIG. 1. FIG. 4 is a drawing showing the arrangement of sample shots for determining an inclined plane (an approximate plane for the entire exposure surface of the wafer 9) of the entire surface of the wafer during the operation. Although FIG. 4 shows four sample shots, at least three shots are sufficient for determining an inclined plane of the wafer.

The operation of the aligner is described below with reference to the flowchart of FIG. 5.

When a start command is input to the CPU 4 from command means (not shown), the CPU 4 transfers the wafer 9 and loads it on the focusing position alignment stage 7 by a wafer transfer system (not shown), in Step S21. The X-Y stage is driven to a sample shot position for measuring the entire plane of the wafer in Step S22. A defocusing amount is detected at the center of each of the sample shots by the focusing detection systems 2 in Step S23. A decision is then made in Step S24 whether or not measurements at all sample shots $S_1$ to $S_4$ for measuring the wafer plane are completed. If measurements are not completed, the operation moves to Step S25 for continuing measurement. If measurements are completed, the operation moves to Step S26.

An approximate plane of the exposure surface of the wafer 9 is determined based on the detection result (position in the Z direction) obtained at each of the sample shots (measurement points) and data regarding the measurement positions (position in the X-Y directions) in Step S26, and the approximate plane is stored in the CPU 4. The X-Y stage 6 is then moved to a first exposure shot position in Step S27. A defocusing amount is detected at each of the detection points 11 (shown in FIG. 2) within an exposure region by the focusing detection systems 2 in Step S28. A decision is made in Step S29 whether or not defocusing amounts are detected at at least three of the five detection points. When defocusing amounts are detected at at least three points, the operation moves to Step S30. When defocusing amounts are detected at less than three points, the operation moves to Step S37. When defocusing amounts are detected at less than three points represents a case wherein since the exposure region is in the peripheral portion of the wafer 9, at least three detection points of the five detection points 11 are out of the surface of the wafer 9, and thus, a plane within the exposure region cannot be determined. In this case, the defocusing amounts are compared with the values obtained by measurement at the previous shot, as described below.

In Step S30, an approximate plane of the exposure surface of the wafer 9 within the exposure region 10 is then determined based on the result (position in the Z direction) obtained by detection at each of the detection points 11 in Step S28 and data regarding the positions of the detection points (positions in the X-Y directions). The approximate plane determined for the exposure surface is compared with the approximate plane of the entire surface of the wafer 9, which is determined in Step S26, to determine a deviation (difference of inclination) between both planes in Step S31. The determined deviation is then compared with a specified value (tolerance) in Step S32. If the deviation exceeds the tolerance, it is 20 decided that contamination might be present, and the operation moves to Step S39 for interrupting the sequence. When the sequence is interrupted, it is possible to select continuation of the sequence or stoppage (forced recovery) of processing of the wafer in accordance the directions from an operator. When the operator provides instructions to continue the sequence, the operation moves to Step S33. When it is decided in Step S32 that the deviation is less than the tolerance, the operation immediately advances to Step S33. Focusing is carried out by the focusing stage 7, followed by exposure in Step S33. A decision is made in the next Step S34 whether or not all shots are completed. When all shots are not completed, the operation returns to Step S27 for carrying out step movement to a next shot position. When it is decided that all shots are completed, the operation advances to Step S35.

On the other hand, when it is decided in Step S29 that defocusing amounts are detected at less than three points of the detection points 11, and when the operation moves to Step S37, a deviation of the defocusing amount detected at a detection point from the defocusing amount detected at the same detection point in the previous shot is determined in Step S37. A decision is then made in Step S38 whether or not the determined deviation is within the predetermined tolerance. If the deviation is within the tolerance, the operation moves to Step S33. If the deviation exceeds the tolerance, the operation moves to Step S39.

A wafer 9 for which all shots are completed or a wafer 9 for which processing is stopped on the basis of directions from the operator in Step S39 is discharged by the wafer transfer system and recovered by a wafer cassette outside the aligner in Step S35. A decision is made in Step S36 whether or not processing of all wafers of one lot is completed.

If processing of all wafers is not completed, the operation returns to Step S21 for transferring a next wafer. If processing of all wafers is completed, the operation of the apparatus is terminated.

Figure 6:
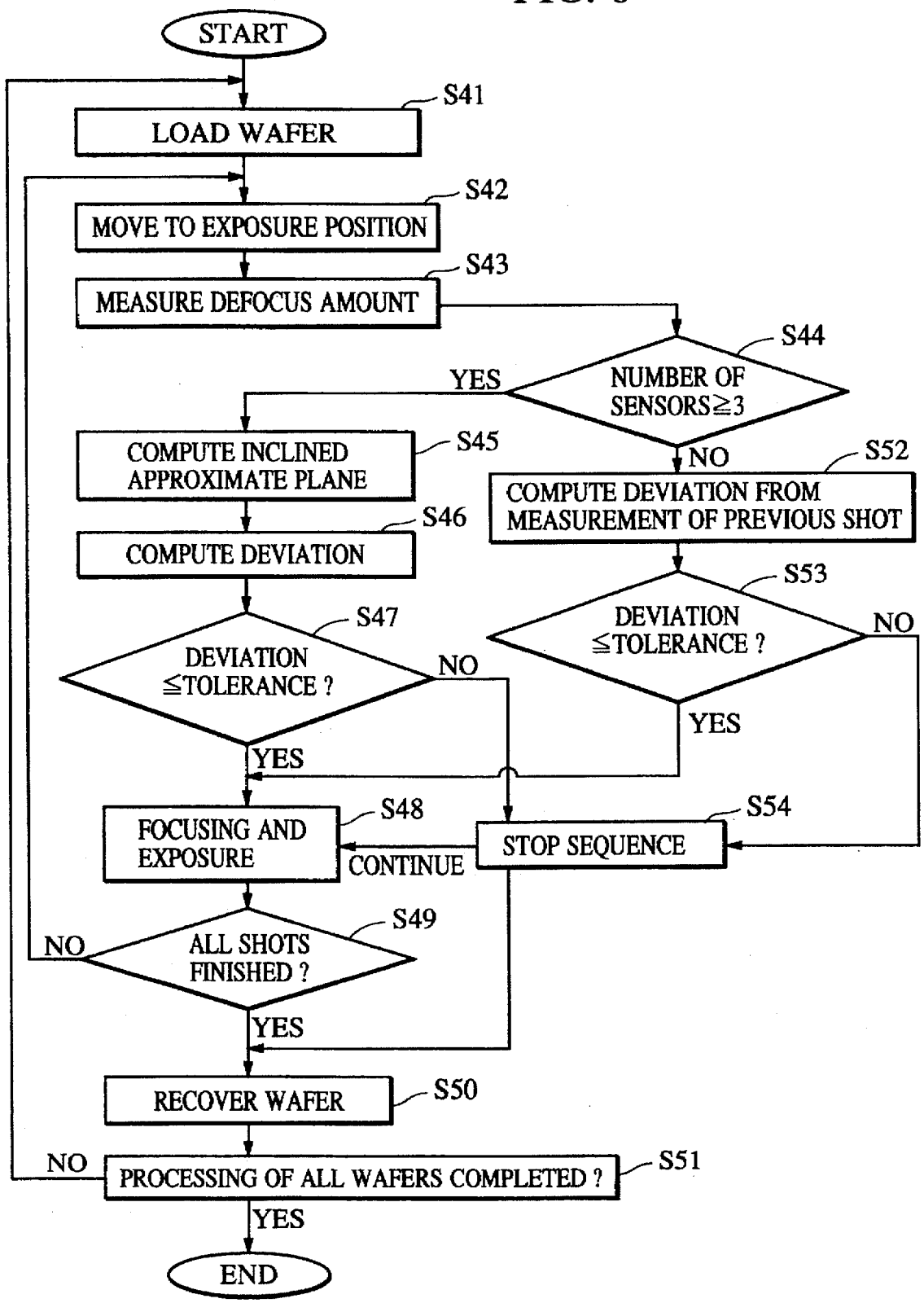
FIG. 6 is a flowchart showing the operation of the aligner shown in FIG. 1, in accordance with a third embodiment of the present invention.

FIG. 6 is a flowchart illustrating the operation of an aligner in accordance with a third embodiment of the present invention. The construction of the aligner is the same as that shown in FIG. 1.

The operation of the aligner is described below with reference to the flowchart of FIG. 6.

When a start command is input to the CPU 4 from command means (not shown), the CPU 4 transfers the wafer 9 and loads it on the focusing position alignment stage 7 by a wafer transfer system (not shown) in Step S41. The X-Y stage 6 is driven to a first exposure shot position in Step S42. A defocusing amount is detected at each of the detection points 11 within an exposure region by the focusing detection systems 2 in Step S43. A decision is then made in Step S44 whether or not defocusing amounts are detected at at least three points of the five detection points. When defocusing amounts are detected at at least three points, the operation advances to Step S45. When defocusing amounts are detected at less than three points, the operation moves to Step S52. When defocusing amounts are detected at less than three points represents a case wherein the exposure region 10 is in the peripheral portion of the wafer 9, and thus, some of the detection points 11 are out of the surface of the wafer 9. In this case, the defocusing amounts are compared with the measurements in the previous shot, as described below.

An approximate plane of the exposure surface of the wafer 9 within the exposure region 10 is determined based on the detection result (position in the Z direction) obtained at each of the detection points 11 in Step S43 and data regarding the positions of the detection points 11 (position in the X-Y directions), in Step S45. Deviations from an approximate plane at the previous exposure position are determined in Step S46. The deviations determined in Step S46 are compared with a specified value (tolerance) in Step S47. If some of the deviations exceed the tolerance, it is decided that contamination might be present, and the operation moves to Step S54 for interrupting the sequence. When the sequence is interrupted, it is possible to select continuation of the sequence or stoppage (forced recovery) of processing of the wafer in accordance with directions from an operator. When the operator provides instructions to continue the sequence, the operation moves to Step S48. When it is decided in Step S47 that the deviations are less than the tolerance, the operation immediately advances to Step S48 for focusing by the focusing stage 7 and then exposure. A decision is then made in Step S49 whether or not all shots are completed. When all shots are not completed, the operation returns to Step S42 for carrying out step movement to a next shot position. When it is decided that all shots are finished, the operation advances to Step S50.

On the other hand, when it is decided in Step S44 that defocusing amounts are not detected at some of the detection points 11, and when the operation moves to Step S52, deviations of the measurements at the detection points 11 where defocusing amounts are detected from the measurements at the same detection positions in the previous shot are determined in Step S52. A decision is made in Step S53 whether or not the deviations are within the predetermined tolerance. If the deviations are within the tolerance, the operation moves to Step S48. If the deviations exceed the tolerance, the operation moves to Step S54.

A wafer 9 for which all shots are completed or a wafer 9 for which processing is stopped on the basis of the direction from the operator in Step S54 is discharged by the wafer transfer system and recovered by a wafer cassette outside the aligner in Step S50. A decision is then made as to whether or not processing of all wafers of one lot is completed.

If the processing of all wafers is not finished, the operation moves to Step S41 for transferring a next wafer. If processing of all wafers is completed, the operation of the aligner is terminated.

Except as otherwise disclosed herein, the various components shown in outline or block form in the figures are individually well known and their internal construction and operation is not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An aligner for exposing a pattern image of an original plate by projecting the image onto an exposure surface of a substrate, which is held on a table, in a focused state through a projection optical system, said aligner comprising:

defocusing detection means for detecting a deviation from a focusing position at each of a plurality of points within an exposure region on the exposure surface of the substrate, which is arranged at an exposure position;

means for determining an approximate plane of the exposure surface of the substrate within the exposure region on the basis of deviation detection values detected at the plurality of points by said defocusing detection means; and decision means for determining a deviation of the approximate plane of the exposure surface of the substrate, on the basis of the deviation detection values detected at each of the plurality of points and for deciding, on the basis of the determined deviation, whether contamination is present between the table and the back side of the substrate.

2. An aligner according to claim 1, wherein, when a sufficient number of detection values are not detected at the plurality of detection points within an exposure region in step-and-repeat exposure of the substrate, said decision means determines a deviation of the approximate plane from each of detection values obtained at detection points within a previous exposure region, to decide whether contamination is present.

3. An aligner for exposing a pattern image of an original plate by projecting the image onto an exposure surface of a substrate, which is held on a table, in a focused state through a projection optical system, said aligner comprising:

focusing detection means for detecting a defocusing from a focusing position at each of a plurality of points within an exposure region on the exposure surface of the substrate, which is arranged at an exposure position;

means for determining an approximate plane of the substrate within the exposure region on the basis of values detected at each of the plurality of points by said focusing detection means; and decision means for determining a deviation of the approximate plane of the substrate at a current exposure position, on the basis of an approximate plane determined for another portion of the exposure surface of the substrate, at a previous shot position and for deciding, on the basis of the determined deviation, whether contamination is present between the table and the back side of the substrate.

4. An aligner according to claim 3, wherein, when a sufficient number of detection values are not detected at the plurality of detection points within an exposure region in step-and-repeat exposure of the substrate, said decision means determines a deviation of the approximate plane from each of detection values obtained at detection points within a previous exposure region, to decide whether contamination is present.

5. An aligner for exposing a pattern image of an original plate by projecting the image onto an exposure surface of a substrate, which is held on a table, in a focused state through a projection optical system, said aligner comprising:

defocusing detection means for detecting a defocusing from a focusing position at each of (i) at least three points on the exposure surface of the substrate and (ii) a plurality of points within an exposure region on the exposure surface of the substrate, which is arranged at an exposure position;

means for determining an approximate plane of the entire exposure surface of the substrate on the basis of defocusing detection values detected at each of the at least three points on the exposure surface of the substrate;

means for determining an approximate plane within the exposure region on the exposure surface of the substrate on the basis of defocusing detection values detected at each of the plurality of points within the exposure region; and decision means for determining a deviation of the approximate plane of the entire surface of the substrate on the basis of the approximate plane determined within the exposure region, and for deciding, on the basis of the determined deviation, whether contamination is present between the table and the back side of the substrate.

6. An aligner according to claim 5, wherein, when a sufficient number of detection values are not detected at the plurality of detection points within an exposure region in step-and-repeat exposure of the substrate, said decision means determines a deviation of the approximate plane from each of detection values obtained at detection points within a previous exposure region, to decide whether contamination is present.

7. A contamination detecting method applied to an aligner for exposing a pattern image of an original plate by projecting the image onto an exposure surface of a substrate, which is held on a table, in a focused state through a projection optical system, said method comprising the steps of;

detecting defocusing from a focusing position at each of a plurality of points within an exposure region on an exposure surface of the substrate, which is arranged at an exposure position;

determining an approximate plane of said exposure surface of said substrate within the exposure region on the basis of detection values detected at each of the plurality of detection points;

determining a deviation of the approximate plane on the basis of each of the detection values detected at the plurality of detection points; and deciding, on the basis of the determined deviations, whether contamination is present between the table and the back side of the substrate.

8. A contamination detecting method according to claim 7, further comprising, when a sufficient number of defocusing detection values are not detected at the plurality of detection points within the exposure region in step-and-repeat exposure, determining a deviation of the approximate plane from each of detection values obtained at detection points within a previous exposure region, to decide whether contamination is present.

9. A contamination detecting method applied to an aligner for exposing a pattern image of an original plate by projecting the image onto an exposure surface of a substrate, which is held on a table, in a focused state through a projection optical system, said method comprising the steps of;

detecting defocusing from a focusing position at each of a plurality of points within an exposure region on an exposure surface of the substrate which is arranged at an exposure position;

determining an approximate plane of the substrate within the exposure region on the basis of defocusing detection values detected at each of the plurality of detection points;

determining a deviation of the approximate plane of the substrate at a current position, on the basis of an approximate plane determined for another portion on the exposure surface of the substrate, at a previous exposure position; and deciding, on the basis of the determined deviation of the approximate plane of the substrate at the current position, whether contamination is present between the table and the back side of the substrate.

10. A contamination detecting method according to claim 9, further comprising, when a sufficient number of defocusing detection values are not detected at the plurality of detection points within the exposure region in step-and-repeat exposure, determining a deviation of the approximate plane from each of detection values obtained at detection points within a previous exposure region, to decide whether contamination is present.

11. A contamination detecting method applied to an aligner for exposing a pattern image of an original plate by projecting the image onto an exposure surface of a substrate, which is held on a table, in a focused state through a projection optical system, said method comprising the steps of;

detecting defocusing from a focusing position at each of at least three points on an exposure surface of the substrate;

detecting defocusing from the focusing position at each of a plurality of points within an exposure region on the exposure surface of the substrate, which is arranged at an exposure position;

determining an approximate plane of the entire exposure surface of the substrate on the basis of defocusing detection values detected at the at least three points on the exposure surface of the substrate;

determining an approximate plane within the exposure region on the exposure surface of the substrate, on the basis of defocusing detection values detected at each of the plurality of detection points within the exposure region;

determining a deviation of the approximate plane of the entire surface of the substrate, on the basis of the approximate plane determined within the exposure region; and deciding, on the basis of the determined deviation of the approximate plane of the entire surface of the substrate, whether contamination is present between the table and the back side of the substrate.

12. A contamination detecting method according to claim 11, further comprising, when a sufficient number of defocusing detection values are not detected at the plurality of detection points within the exposure region in step-and-repeat exposure, determining a deviation of the approximate plane from each of detection values obtained at detection points within a previous exposure region, to decide whether contamination is present.

* * * * *

UNITED STATES PATENT AND TRADEMARK OFFICE
CERTIFICATE OF CORRECTION

PATENT NO. : 5,710,624
DATED : January 20, 1998
INVENTOR(S) : SHINJI UTAMURA

It is certified that error appears in the above-identified patent and that said Letters Patent is hereby corrected as shown below:

COLUMN 3:

Line 9, "each" should read --each of--.

COLUMN 6:
Line 57, "20" should be deleted; and
Line 61, "accordance" should read --accordance with--.

COLUMN 10:
Line 12, "of;" should read --of:--; and
Line 39, "of;" should read --of:--.

COLUMN 11:
Line 4, "of;" should read --of:--.

Signed and Sealed this

Fourth Day of August, 1998

*Attest:*

*Attesting Officer*

BRUCE LEHMAN

*Commissioner of Patents and Trademarks*